US005934196A

United States Patent [19]

Korem

[11] Patent Number: 5,934,196

[45] Date of Patent: Aug. 10, 1999

[54] PRINTING MEMBER AND METHOD FOR PRODUCING SAME

[75] Inventor: Aharon Korem, Herzlia, Israel

[73] Assignee: Scitex Corporation Ltd., Herzlia, Israel

[21] Appl. No.: 08/804,974

[22] Filed: Feb. 20, 1997

[30] Foreign Application Priority Data

| | | | |
|---|---|---|---|
| Feb. 20, 1996 | [IL] | Israel | 117204 |
| Feb. 20, 1996 | [IL] | Israel | 117205 |

[51] Int. Cl.[6] ................................ G03F 7/00; G03F 7/26

[52] U.S. Cl. .......................... 101/467; 101/456; 430/302; 430/327

[58] Field of Search .................................... 101/456, 457, 101/460, 462, 463.1, 465–467, 477; 430/302, 327, 616, 964

[56] References Cited

U.S. PATENT DOCUMENTS

| | | | |
|---|---|---|---|
| 4,278,756 | 7/1981 | Bouldin et al. | 430/414 |
| 4,284,716 | 8/1981 | Drexler et al. | 430/510 |
| 4,314,260 | 2/1982 | Drexler | 346/135.1 |
| 4,363,870 | 12/1982 | Bouldin | 430/510 |
| 4,465,767 | 8/1984 | Oba et al. | 430/271 |
| 4,563,410 | 1/1986 | De Jaeger et al. | 430/204 |
| 4,753,864 | 6/1988 | Bouldin et al. | 430/273 |
| 5,339,737 | 8/1994 | Lewis et al. | 101/454 |
| 5,401,611 | 3/1995 | Edwards, Sr. et al. | 430/276 |

FOREIGN PATENT DOCUMENTS

| | | |
|---|---|---|
| 0 101 266 | 2/1984 | European Pat. Off. . |
| 0 394 874 B1 | 10/1993 | European Pat. Off. . |
| 1 496 152 | 7/1969 | Germany . |
| 116885 | 1/1996 | Israel . |
| 1 208 731 | 10/1970 | United Kingdom . |

OTHER PUBLICATIONS

Technical Guide: Mitsubishi Graphic Arts Materials, Silver–Digiplate.

Tritton, K., "Developments in Plate Imaging and Imposition for Short Run Systems", Pira International, Nov. 1992.

*Primary Examiner*—Stephen R. Funk

*Attorney, Agent, or Firm*—Darby & Darby

[57] ABSTRACT

A processless visible light insensitive, IR sensitive printing member, is provided together with a method for producing the printing member. The method includes the steps of providing a visible light sensitive printing member and the step of processing the visible light sensitive printing member so as to receive a visible light insensitive, IR radiation sensitive printing member therefrom. The processing step is carried out in a visible light free environment.

10 Claims, 5 Drawing Sheets

FIG. 1 PRIOR - ART

PRINTING MEMBER AND METHOD FOR PRODUCING SAME

FIELD OF THE INVENTION

The present invention relates to printing systems, printing members and methods for producing same in general and in particular to printing systems which employ wet processless lithographic printing members and to methods for producing same.

BACKGROUND OF THE INVENTION

Traditionally, in the pre-press industry, printing members to be used in a printing press are recorded by a contact process from a photographic film produced by a laser plotter, the film including a half tone image representing the original image to be subsequently reproduced in the printing press.

In the last decade, it has been realized that the digital representation of an image to be reproduced in a printing press may be recorded directly on a printing member, thus obviating the use of films. This process is usually termed computer to plate or computer to press, both usually referred to as CTP.

In computer to plate process, the printing member is produced directly by a plate setter, such as the Raystar, commercially available from Scitex Corporation Ltd. of Herzlia, Israel. In the computer to press process, the printing member is produced on a digital press, in particular in a digital lithographic press, such as the Quick Master DI46-4, commercially available from Heidelberg Druckmachinen of Germany. In this process, the image is recorded on the printing member on-press, i.e. while the printing plate is mounted on the printing press.

Printing members suitable for CTP include visible light sensitive silver halide based printing members, ablative printing members and photopolymer printing members. Examples for silver halide based printing members include the SETPRINT HN, commercially available from Agfa Gaevert of Belgium or the SDP-FH100/175, commercially available from Mitsubishi of Japan. An example of an ablative printing member include the Pearl plate, commercially available from Presstek Inc. of New Hampshire, U.S. An example of a photopolymer printing member includes the 3M Viking, commercially available from Minnesota Mining and Manufacturing company (3M) of the U.S.

Prior art CTP printing members require a process other than the recording of the image representing the image to be reproduced by the printing press thereon. In the Pearl and 3M Viking printing members the process is post imaging, i.e., for the Pearl Plate the ablated portions, which are parts physically removed from the printing member so as to form the image thereon, have to be removed before actual printing. Similarly, for the 3M Viking plate a washing process is required.

In the silver halide based printing members further processing is required. Since these printing members are visible light sensitive, they are first imaged in a dark, visible light free environment, by a visible light exposure beam so as to record the image to be reproduced thereon as indicated in step 2 of FIG. 1 to which reference is now made. The exposure beam, usually a modulated red light laser beam in the range of 620–670 nanometers records a pattern representing the image to be printed on the printing member. Then as indicated by 4, the printing member is processed by dedicated chemistry to form the processed printing member ready for mounting on a printing press.

As the printing member is sensitive to visible light, the processing step 4 is also carried in a dark, visible light free environment.

The processing step 4 usually includes the use of an activator and a stabilizer, such as the commercially available Mitsubishi Silver Digiplate System including the SLM-AC activator and the SLM-ST stabilizer. The use of the activator and the stabilizer are followed by a washing step, usually by water, and subsequent drying.

Thus, a major drawback of prior art CTP printing members is that they require processing of some sort at the user's end other than the recording of the pattern representing the image to be reproduced thereon.

In particular, a major drawback of light sensitive silver halide based prior art printing members is that the entire process including exposure and chemical processing must be carried in a dark, visible light free environment as indicated by the dashed lines referenced 6.

Prior art silver halide based printing members, such as printing member 20 illustrated in FIG. 2 include a support base layer 22, such as a polyester, paper or metal base layer and a silver halide emulsion layer 24, such as a gelatine based layer having silver halide therein, the layer 24 being coated on base layer 22. After exposure in a plate setter, the printing member is chemically processed as described above. The resulting reduced silver areas in the exposed portions are oleophilic whereas the background is hydrophilic.

SUMMARY OF THE INVENTION

A primary object of the present invention is to provide a processless CTP printing member.

The term processless printing member refers herein to a printing member which requires no processing other than imaging, i.e. the recordation of the pattern representing an image or the negative of an image to be reproduced by the printing press whether a conventional printing press or a digital printing press.

Another object of the present invention is to provide an improved visible light insensitive CTP printing member.

Yet another object of the present invention is to provide a silver halide visible light insensitive, IR radiation sensitive CTP printing member which may be exposed to an IR radiation source so as to form a pattern representing an image thereon.

A further object of the present invention is to provide a method for producing a processless printing member.

Yet a further object of the present invention is to provide a method for producing a silver halide based visible light insensitive, IR sensitive printing member.

Another object of the present invention is to provide an IR sensitive printing member which may be exposed to IR radiation to provide an analog and/or digital image or any combination thereof.

Another object of the present invention is to provide an improved digital wet lithographic digital printing press capable of employing processless printing members.

Yet another object of the present invention is to provide a module for converting a conventional wet lithographic press to a digital wet lithographic press employing processless printing members.

There is thus provided, according to a preferred embodiment of the present invention, a method for producing a processless visible light insensitive, IR sensitive printing member, which includes the steps of providing a visible light sensitive printing member and the step of processing the visible light sensitive printing member so as to receive a visible light insensitive, IR radiation sensitive printing member therefrom. The processing step is carried out in a visible light free environment.

According to a preferred embodiment of the present invention, the visible light sensitive printing member includes at least a first layer and a second layer. The first layer is preferably a base layer and the second layer is preferably an emulsion layer including silver halide therein.

There is also provided, in accordance with a preferred embodiment of the present invention a method for producing a processless wet lithographic printing member, which includes the following steps:

a. processing a visible light sensitive printing member so as to receive a visible light insensitive, IR radiation sensitive printing member therefrom, the visible light insensitive, IR radiation sensitive printing member which includes at least a base layer and an overlaying oleophilic layer; and b. selectively exposing the visible light insensitive IR radiation printing member to at least one beam of IR radiation so as to form a hydrophilic layer representing a negative of an image thereon.

Further, according to a preferred embodiment of the present invention, the base layer is selected from the group of polyester, paper and metal and wherein the overlaying layer is an emulsion layer including silver halide.

Further, according to a preferred embodiment of the present invention, the sensitivity of the printing member prior to the processing step is maximal between 600–650 nanometers and the sensitivity of the printing member after the processing step is in the near IR region between 700–1024 nanometer.

Still further, in accordance with a preferred embodiment of the present invention, the processing step is a chemical processing step. Preferably, the chemical processing includes the step of employing an activator to activate the printing member; and employing a stabilizer to stabilize a printing member.

There is also provided, according to each preferred embodiment of the present invention, a printing member which is produced in accordance with the disclosed method.

In accordance with a preferred embodiment of the present invention, the printing member is a negative printing member, the exposed areas according to the pattern representing the image are hydrophilic and the remaining area of the plate is oleophilic.

Further, according to a preferred embodiment of the present invention, there is provided a processless lithographic printing member which includes a base layer and at least a top visible light insensitive oleophilic layer.

According to a preferred embodiment of the present invention, upon exposure to IR radiation, exposed areas of the top layer become hydrophilic.

Further, according to a preferred embodiment of the present invention, the maximal sensitivity of the printing member to IR radiation is in the near IR region between 700 nanometers and 1024 nanometers.

There is also provided, in accordance with a preferred embodiment of the present invention, a lithographic printing press which includes at least one printing station, each printing station includes:

a) a processless lithographic printing member which includes a base layer and at least a top visible light insensitive oleophilic layer which forms a printing surface;

b) a rotatable printing cylinder for supporting the processless printing member;

c) an imaging system for exposing the printing member to IR radiation, thereby forming a hydrophilic pattern representing a negative of an image to be printed by the printing station on the processless printing member;

d) a dampening solution reservoir including a dampening solution attracted to the hydrophilic pattern once the processless printing member passes through the dampening solution;

e) an inking station for applying ink onto the printing member; and f) a transfer system for transferring the applied ink onto a printing substrate.

According to a preferred embodiment of the present invention, the imaging system includes at least one IR radiation source that produces an exposure imaging output, an optical assembly for guiding the exposure imaging output of the at least one IR radiation source to focus on the printing surface and means for moving the IR radiation source and the optical assembly relative to the printing surface.

Further, according to a preferred embodiment of the present invention, the processless printing member has maximal sensitivity to IR radiation in the near IR region between 700 nanometers and 1024 nanometers.

Still further, according to a preferred embodiment of the present invention, the at least one IR radiation source includes at least one laser diode. Preferably, the output of each of the at least one laser diode is larger than 0.5 Watts.

Still further, according to a preferred embodiment of the present invention, the transfer system includes a blanket cylinder for transferring the applied ink to a printing substrate and an impression cylinder for pressing the printing substrate against the blanket cylinder.

Additionally, according to a preferred embodiment of the present invention, the printing press also includes a feeding system for feeding the processless printing member to the printing cylinder. The feeding system may be manual or automatic, external or internal to the printing cylinder.

There is also provided, in accordance with a preferred embodiment of the present invention, a printing method for printing a printing substrate in a lithographic printing press which includes at least one printing station, each printing station for printing a color on the printing substrate, the method includes the steps of:

a) mounting a processless lithographic printing member which includes a base layer and at least a top visible light insensitive oleophilic layer which forms a printing surface on a rotatable printing cylinder for supporting the processless printing member;

b) exposing the printing surface to IR radiation, thereby forming a hydrophilic pattern representing a negative of an image to be printed by the printing station on the processless printing member;

c) dampening the printing member in a dampening solution attracted to the hydrophilic pattern;

d) applying ink onto the printing member; and e) transferring the applied ink onto the printing substrate.

Further, according to a preferred embodiment of the present invention, the step of exposing includes the steps of:

a) producing an exposure imaging output;

b) guiding the exposure imaging output of the at least one IR radiation source to focus on the printing surface; and c) moving the exposure imaging output relative to the printing surface so as to provide a scan of the printing member.

Further, according to a preferred embodiment of the present invention, the step of transferring comprises:

a) transferring said applied ink to an intermediate medium; and b) transferring said ink from said intermediate medium to said printing substrate.

Finally, there is provided according to a preferred embodiment of the present invention a module for a lithographic printing press having a processless lithographic printing member which includes a base layer and at least a top visible light insensitive oleophilic layer which forms a printing surface mounted on a printing cylinder of at least one printing station thereof, wherein the module includes an imaging system for exposing the printing member to IR radiation, thereby forming a hydrophilic pattern representing a negative of an image to be printed by the printing station on the processless printing member.

According to a preferred embodiment of the present invention, the imaging system is similar to the imaging system employed in the printing press.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1:
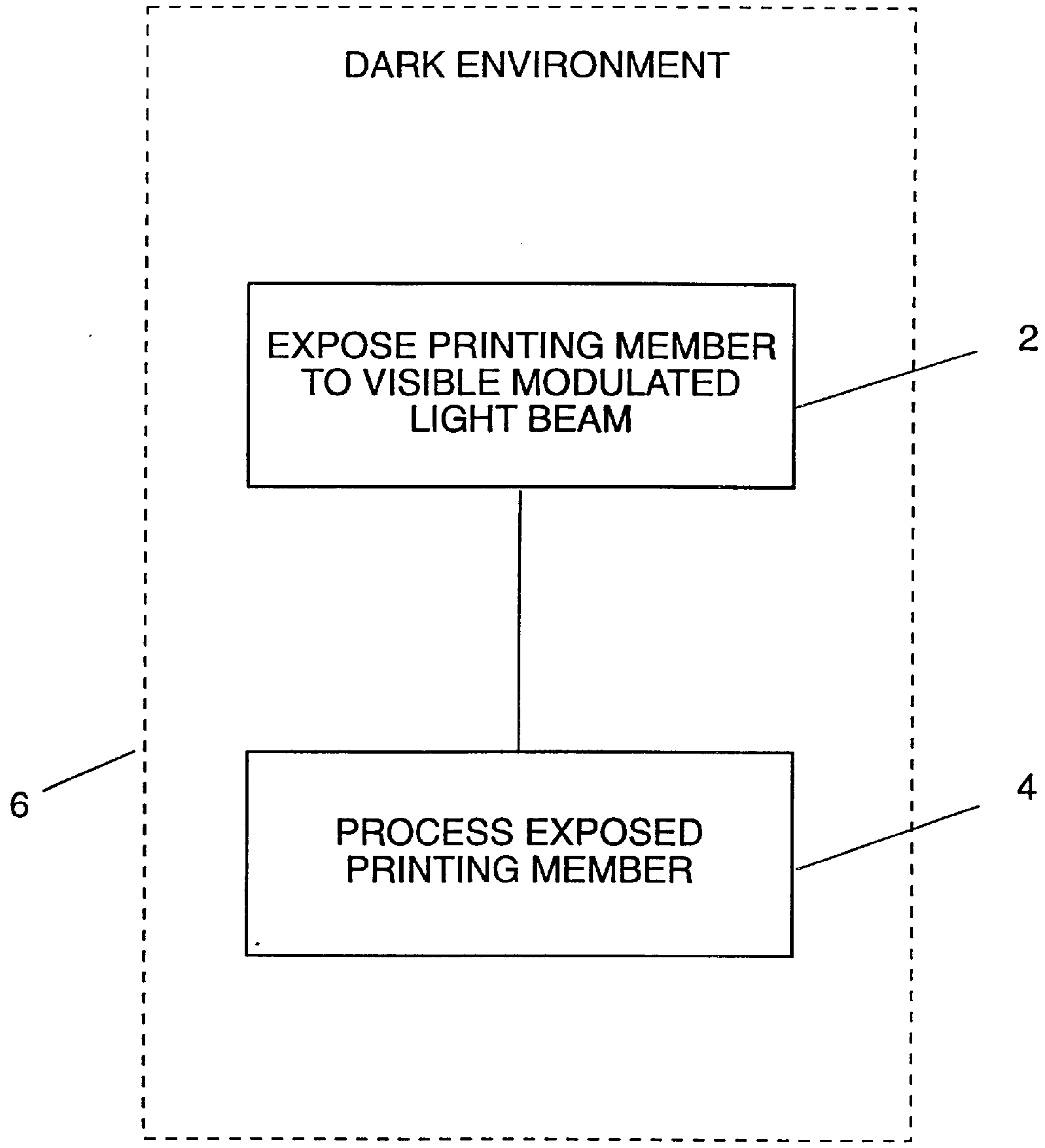
FIG. 1 is a schematic block diagram illustration of a prior art method for producing a printing member.
Figure 2:
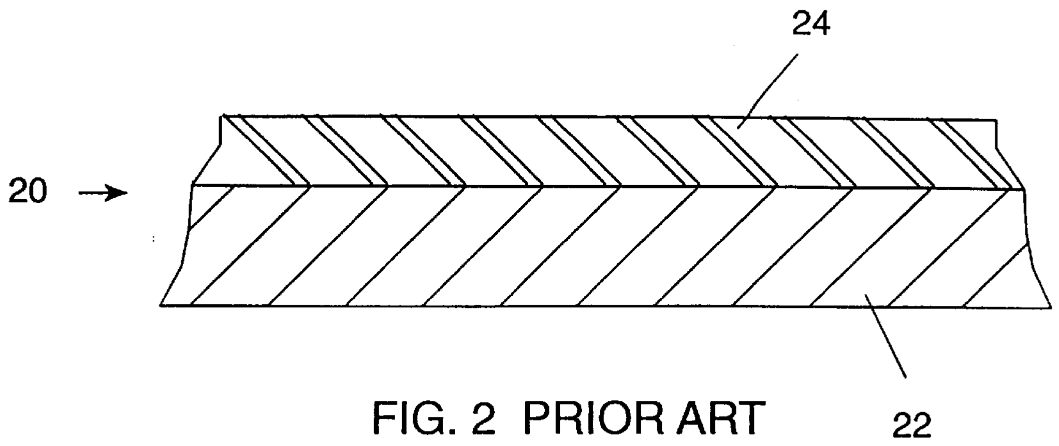
FIG. 2 PRIOR ART
FIG. 2 is a schematic cross section illustration of a prior art silver halide based printing member.
Figure 3:
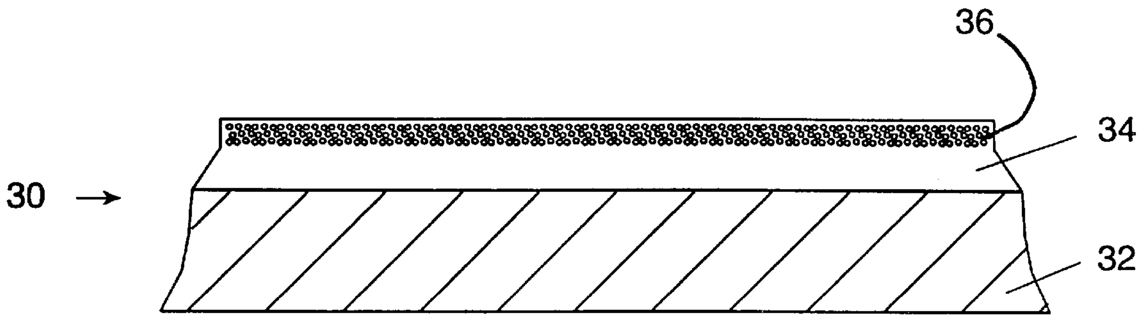
FIGS. 3 and 4 are schematic cross section illustrations of a processless printing member, constructed according to a preferred embodiment of the present invention, before and after exposure, respectively.
Figure 4:
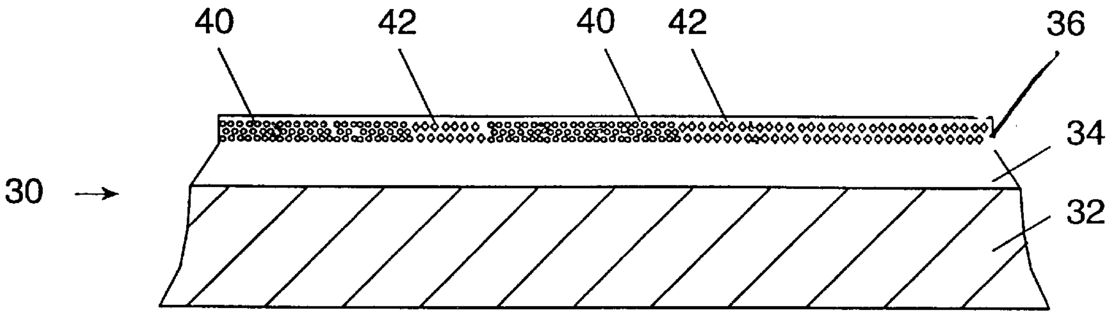

Reference is now made to FIGS. 3 and 4 which illustrate, respectively, a pre-exposed and an exposed processless silver based printing member constructed according to a preferred embodiment of the present invention.

The printing member 30 is a lithographic printing member which comprises a support base layer 32, such as a polyester, paper or metal base layer, an intermediate layer 34 and an oleophilic layer 36. The printing member 30 is a processless, visible light insensitive, IR sensitive printing member. Optionally, printing member 30 includes additional layers, such as back coating layer for coating the other side of the base layer 32.

After exposure to an IR radiation source, such as an IR laser diode as described in detail hereinbelow, areas of layer 36 representing the image to be printed remain intact as indicated by reference numeral 40 and hence remain oleophilic. Exposed areas form the hydrophilic portions 42 of the printing member 30.

It will be appreciated that the printing member 30 does not require any further processing before it is being utilized by a printing press for application of ink thereon as described in detail hereinbelow.

It will further be appreciated that printing member 30 is a negative printing member, i.e. the pattern recorded thereon represents the negative of the image to be printed and forms the hydrophilic portions 42. Correspondingly, the image is represented by oleophilic portions 40.

In an alternative embodiment, printing member 30 can be exposed to an IR radiation source in analog or digital mode in order to provide images containing either or both analog (Continuous Tone) and digital (screen and line work) images.

It will thus be appreciated that in analog mode, the level of exposure to IR radiation will determine the proportion of hydrophilic and oleophilic portions 42 and 40, respectively. Thus, the image exposed in analog mode is proportional to the level of IR radiation, in contrast to an image exposed in digital mode.

Figure 5:
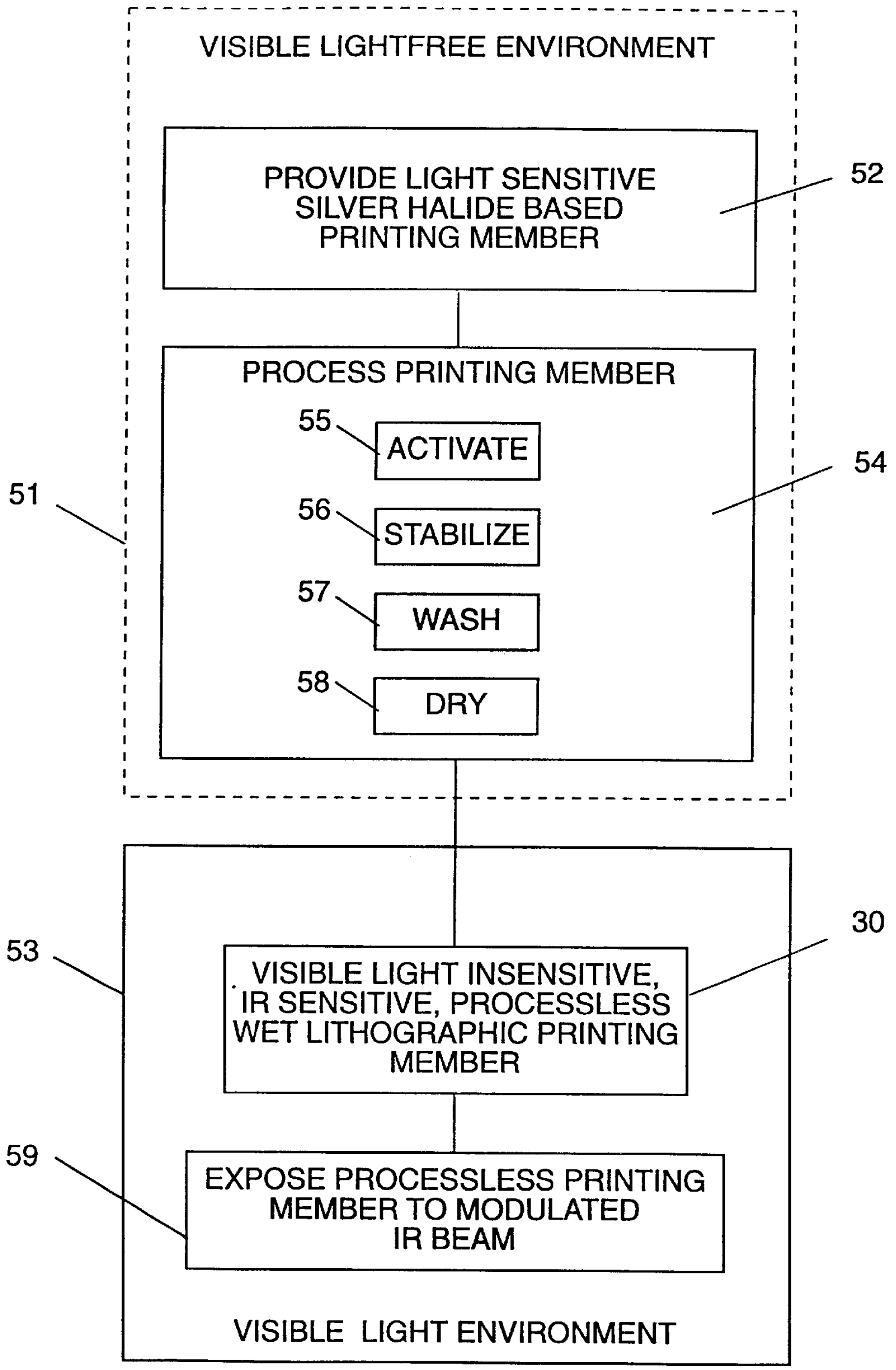
FIG. 5 is a schematic block diagram illustration of a method for producing the printing member of FIGS. 3 and 4.

Reference is now made to FIG. 5 which illustrates a preferred method of producing the printing member 30. It will be appreciated that while the present invention is described with respect to the method of FIG. 5, it is not limited thereto and the printing member 30 may be produced in any alternative way.

The method for producing a processless printing member according to a preferred embodiment of the present invention includes the step of processing a prior art unprocessed visible light sensitive printing member employing chemical processing procedures previously used to process exposed printing members so as to form a visible light insensitive, IR radiation sensitive printing member therefrom.

In the preferred embodiment and as shown in the non limiting examples hereinbelow, the prior art visible light sensitive printing members include a polyester base layer 22 with a silver halide based coating 24 thereon. It will be appreciated that the base layer may be any other suitable base layer, such as paper or aluminum.

Referring now specifically to FIG. 5, step 52 indicates that a prior art visible light sensitive printing member is provided. The printing member is processed as indicated by step 54. Steps 52 and 54 are carried out in a dark, substantially visible light free environment as indicated by dashed lines 51.

The processing stage 54 comprises chemical processing which includes the step 55 of activating the printing member provided at 52 and the step 56 of stabilizing the printing member. The printing member may be then washed as indicated by 57 and dried as indicated by 58 so as to provide a visible light insensitive, IR radiation sensitive printing member as indicated by step 59.

The resulting printing member is a visible light insensitive, IR radiation sensitive processless printing member suitable as a printing member for CTP applications and which is handled in visible light environment as indicated by 53. For example, the printing member 30 may be stored in visible light environment, thereby obviating the difficulties associated with darkroom or dark box storage.

It will be appreciated that a particular feature of the present inventions that while in the prior art, the chemical processing of silver halide based printing members was done at the user end, the chemical processing according to the present invention is done at the manufacturer's end.

The processed printing member 30 may now be exposed to IR radiation by employing any suitable IR radiation, such as IR laser diodes, as indicated by step 59. The printing member is preferably exposed to a pattern representing a negative of an image to be printed so as to provide a wet lithographic printing member suitable both for CTP and digital wet lithographic printing systems.

Following are a number of non limiting examples illustrating certain features of the present invention.

EXAMPLE I

A pre-processed SETPRINT HN printing member which has a polyester substrate and a silver halide based overlaying coating, commercially available from Agfa Gaevert of Belgium has been used. The sensitivity of the pre-processed printing member was maximal at 630±20, 650±20 nanometer.

The printing member has been processed in a chemical processing system employing Mitsubishi Silver Digiplate System chemicals which includes the SLM-AC activator and the SLM-ST stabilizer.

The printing member was subsequently washed by water and dried.

Processing time was 30 seconds and the temperature was 29° C.

The resulting processed printing member was insensitive to visible light.

The processed printing member was exposed by a 1 Watt IR laser diode having a wavelength of 830 nanometers. A visible pattern representing a negative of an image to be printed was obtained.

The pattern was hydrophilic whereas non exposed surfaces of the printing member were oleophilic, thus providing a wet lithographic printing member.

EXAMPLE II

A pre-processed SETPRINT HN printing member which has a polyester substrate and a silver halide based overlaying coating, commercially available from Agfa Gaevert of Belgium has been used. The sensitivity of the pre-processed printing member was maximal at 630±20, 650±20 nanometer.

The printing member has been processed in a chemical processing system, employing an Agfa Gaevert Chemistry which includes the G-260-B activator and the G-360-B stabilizer.

The printing member was subsequently washed by water and dried.

Processing time was 20 seconds and the temperature was 32° C.

The resulting processed printing member was insensitive to visible light.

The processed printing member was exposed by a 1 Watt laser diode having a wavelength of 830 nanometers. A visible pattern representing a negative of an image to be printed was obtained.

The pattern was hydrophilic whereas non exposed portions of the printing member were oleophilic, thus providing a wet lithographic printing member.

Example 3 was similar to Example 1 except that the Agfa SDP-FH100/175 pre-processed printing member was employed. Example 4 was similar to Example 2 except that the Agfa SDP-FH100/175 pre-processed printing member was employed.

Figure 6:
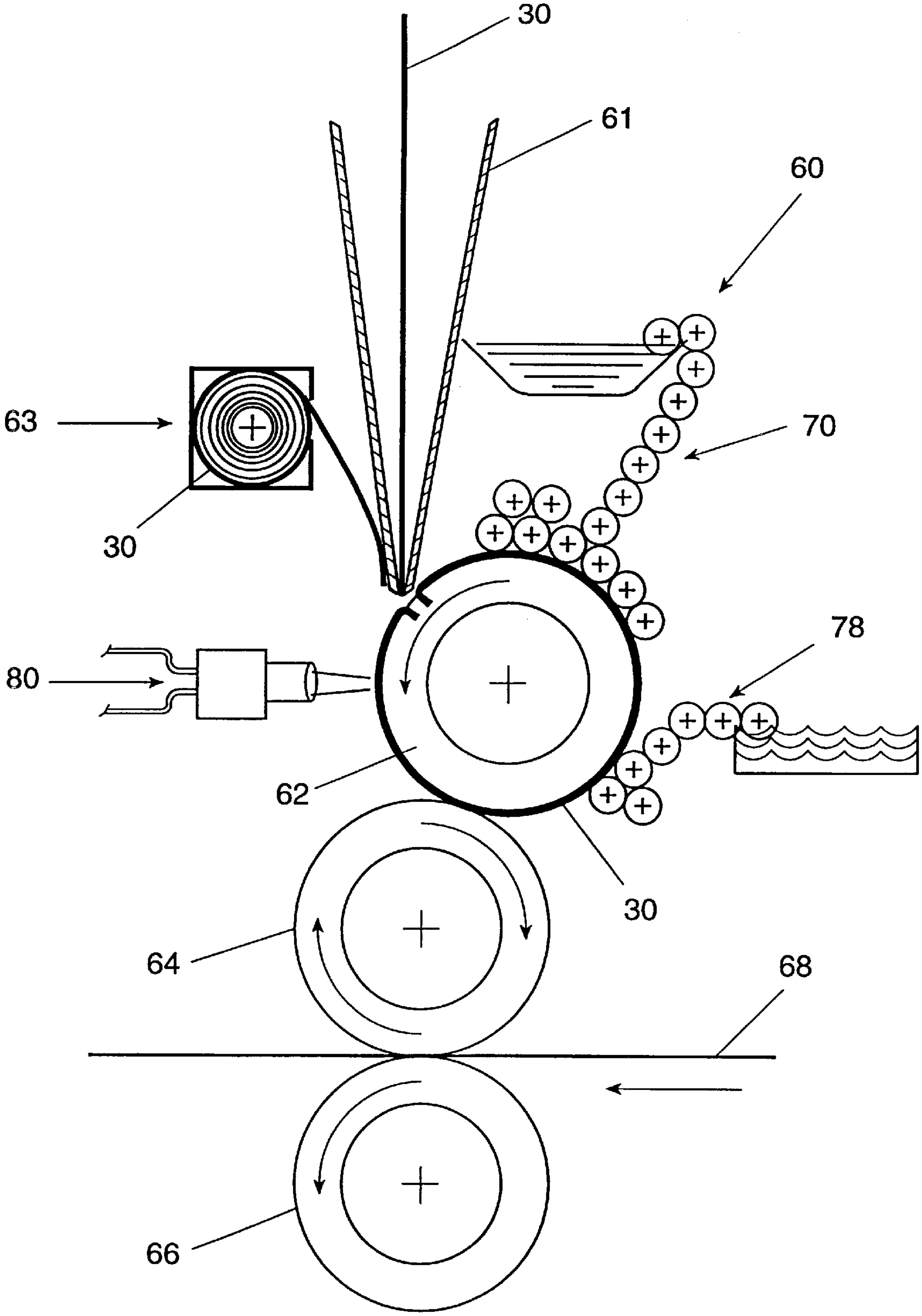
FIG. 6 is a schematic pictorial illustration of a printing station of a digital wet lithographic press, constructed according to a preferred embodiment of the present invention.

Reference is now made to FIG. 6 which illustrates a printing station of a digital wet lithographic printing press, constructed according to a preferred embodiment of the present invention. The printing station 60 preferably comprises a printing cylinder 62 on the periphery of which printing member 30 is mounted. Printing station 60 also comprises a blanket cylinder 64 for receiving the ink applied by movable inking stations 70 on the printing member 30 mounted on printing cylinder 62 and for transferring it to the printing substrate 68 on which the image is reproduced. The printing substrate, usually but not necessarily paper, is pressed against an impression cylinder 66.

Processless printing member 30 may be mounted on printing cylinder 62 in any fashion known in the art, manually or automatically. In the illustrated non limiting embodiment, printing member 30 is automatically fed from an external cassette 63 enclosing a roll of printing member 30 therein. Alternatively, the feeding cassette may be internal, i.e. within printing cylinder 62. Optionally, the illustrated embodiment includes a manual feel option via loader 61 which is particularly suitable for aluminum based printing members.

Printing station 60 also comprises a movable dampening solution reservoir 78 and an imaging system 80 for recording the pattern representing the image to be reproduced on member 30 while mounted on plate cylinder 62.

Printing station 60 operates in three operation modes, a loading mode in which printing member 30 is fed and mounted on the periphery of printing cylinder 62, an imaging mode and a printing mode. In the imaging operation mode, inking station 70 and the dampening solution reservoir 78 are moved away from plate cylinder 62. In this mode, the pattern representing the negative of the image to be printed in the printing operation mode is recorded by imaging system 80 on the printing member 30.

In the printing operation mode, which follows the imaging mode without any intermediate processing step of printing member 30, dampening solution reservoir 78 and inking station 70 are moved towards the printing cylinder 62. In each printing cycle, the printing cylinder 62 with exposed printing member 30 is bathed in reservoir 78, the dampening solution is attracted to the hydrophilic portions 42 and ink from the inking station 70 is applied and is attracted to the oleophilic portions 40. The colored ink is then transferred via blanket cylinder 64 onto the substrate 68.

It will be appreciated that while prior art digital lithographic presses, such as the above mentioned Quickmaster, require an additional step and corresponding unit to remove the material ablated from the printing member during exposure, in the present invention no further processing is required once printing member 30 is exposed.

It will be appreciated that printing presses comprise one or more printing stations 60. A single color printing press includes one printing station whereas a color printing press includes one printing station 60 for each color to be printed, usually four printing stations 60, one for each process color Cyan, Magenta Yellow and Black (CMYK or CMYB).

In one preferred embodiment, the four color printing press of the present invention comprises four printing stations 60 in tandem while printing substrate 68 is moved from one printing station to the other so as to superimpose the CMYK inks thereon.

In a further preferred embodiment, additional printing stations 60 operative to print a special color (e.g. gold) on printing substrate 68 are added.

It will further be appreciated that most commercially available conventional lithographic printing presses are wet printing presses. Hence, the present invention provides a module to be added to a conventional press so as to form a digital wet lithographic printing press therefrom.

Figure 7:
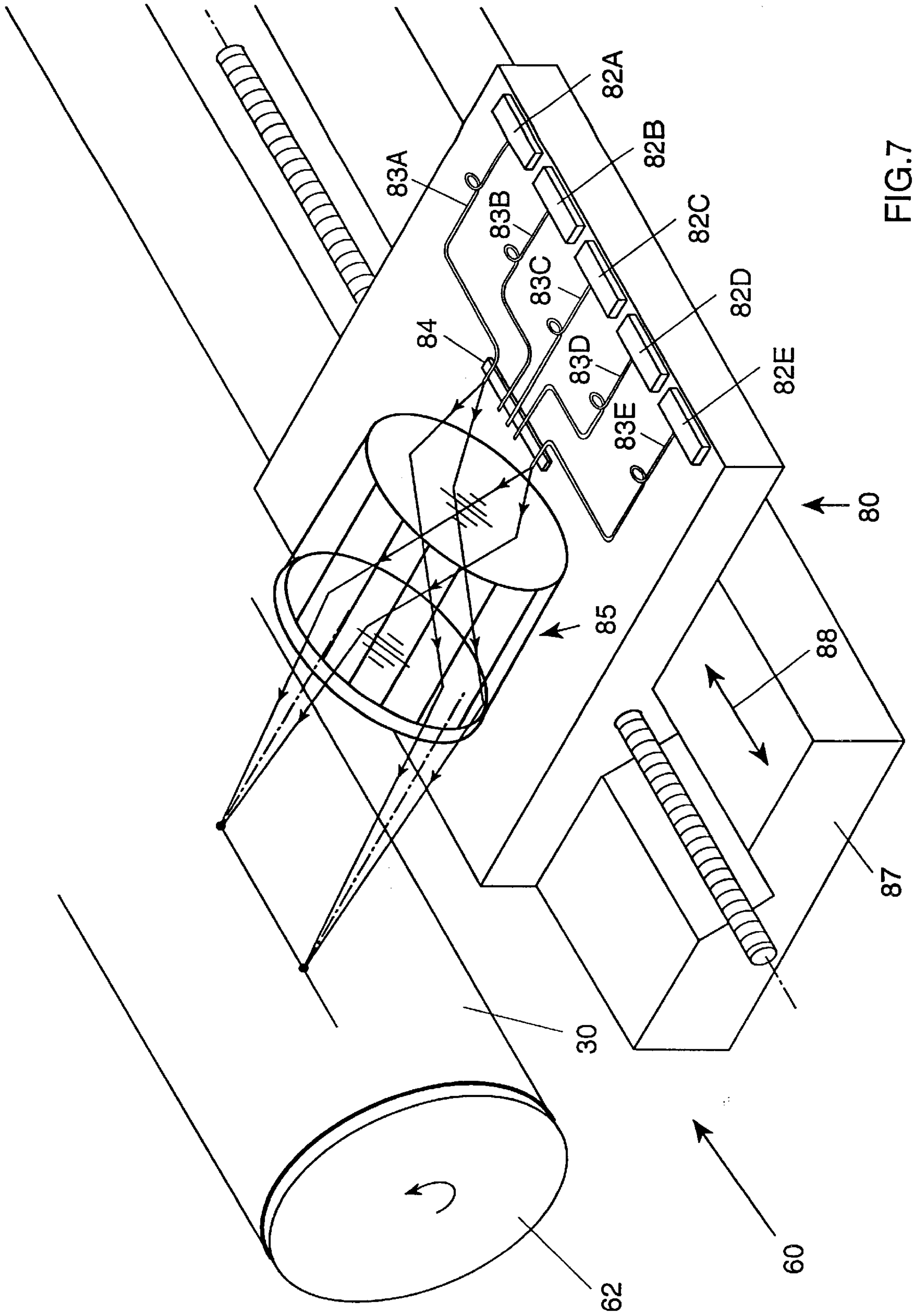
FIG. 7 is a schematic pictorial illustration of a module which converts a conventional wet lithographic press to the digital lithographic press of FIG. 6.

A module for converting a conventional lithographic printing press to a digital lithographic press is illustrated in FIG. 7. FIG. 7 illustrates an imaging system, generally referenced 80 which may form part of the printing station 60 or be used as an add-on module to conventional printing presses.

The imaging system 80 may be any suitable imaging system which comprises an IR radiation source and an optical assembly for producing an output exposure beam from the IR radiation source which records the pattern representing the image to be reproduced on the printing member 30. Imaging system 80 may be a single beam imaging system or a multibeam imaging system. Non limiting examples include the imaging systems described in co-pending IL application 116885 assigned to the assignee of the present invention or the imaging system described in U.S. Pat. No. 5,385,092 to Lewis et al.

In a preferred embodiment, imaging system 80 comprises an array of IR laser diodes 82 of which five, referenced 82A–82E, are shown in the illustrated embodiment. Each laser diode 82 is attached to a corresponding optical fiber 83A–83E in a pigtail type attachment, the light emitting ends of the plurality of fiber optics are aligned at 84. Preferably, the optical fibers 83 are aligned in 84 in a linear array with predetermined spacings therebetween.

The light from all IR laser diodes 82 which is modulated in accordance to the information representing the image to be exposed on the printing member 30 mounted on printing cylinder 62 is focused thereon by a single telecentric lens assembly 85. The telecentric lens assembly 85 is a stationary lens assembly. Alternatively, an autofocus lens mechanism may be used.

To effect scanning, printing cylinder 62 rotates to provide the intraline exposure of printing member 30 wherein the imaging apparatus 80 is movable along a guiding support 87 as indicated by arrow 88 to affect scanning in a spiral fashion of the printing member 30.

It will be appreciated by persons skilled in the art that the present invention is not limited to what has been particularly shown and described hereinabove. Rather, the scope of the present invention is defined only by the claims that follow:

I claim:

1. A method for producing a processless visible light insensitive, IR sensitive printing member from a visible light sensitive printing member, comprising the steps of:

providing a visible light sensitive printing member imageable in a first mode having a base layer and an emulsion layer including silver halide therein on top of said base layer, said printing member having a maximal sensitivity prior to processing of between approximately 610–670 nanometers;

chemically processing said visible light sensitive printing member so as to produce a visible light insensitive, IR radiation sensitive printing member therefrom, having a IR radiation maximal sensitivity in the range of approximately 700–1024 nanometers and imageable in a second mode, wherein said step of chemically processing comprises:

employing an activator to activate said printing member; and employing a stabilizer to stabilize said printing member.

2. A method according to claim 1 wherein the sensitivity of said printing member after said processing is in the near IR region.

3. A method according to claim 1 wherein said processing is carried in a visible light free environment.

4. A method for producing a processless wet lithographic printing member from a visible light sensitive printing member, comprising:

providing a visible light sensitive printing member having a maximal light sensitivity in the range of approximately 610–670 nanometers and imageable in a first mode;

chemically processing said visible light sensitive printing member so as to produce a visible light insensitive, IR radiation sensitive printing member therefrom imageable in a second mode, said visible light insensitive, IR radiation sensitive printing member comprising at least a base layer and an overlying oleophilic layer, wherein said step of chemically processing comprises:

employing an activator to activate said printing member; and employing a stabilizer to stabilize said printing member; and selectively exposing said visible light insensitive, IR radiation sensitive printing member to at least one beam of IR radiation having a IR radiation maximal sensitivity in range of approximately 700–1024 nanometers, so as to form a hydrophilic layer representing a negative of an image thereon.

5. A method according to claim 4 wherein said visible light sensitive printing member comprises said base layer selected from the group of polyester, paper and metal and wherein said overlaying layer is an emulsion layer including silver halide.

6. A method according to claim 4 wherein said the sensitivity of said printing member prior to said processing is maximal between 600–650 nanometers.

7. A method according to claim 4 wherein the sensitivity of said printing member after processing is maximal in the near IR region.

8. A method according to claim 4 wherein said processing is carried in a visible light free environment.

9. A method according to claim 4 wherein said exposing comprises modulating generally simultaneously a plurality of IR radiation sources in accordance with a digital representation representing a negative of said image.

10. A method according to claim 4 wherein said overlaying oleophilic layer includes at least one of the group consisting of silver and silver components.

* * * * *